(12) United States Patent
Outin et al.

(10) Patent No.: US 8,395,449 B2
(45) Date of Patent: Mar. 12, 2013

(54) NETWORK FOR CONTROLLING THE POWER SUPPLY TO A SYSTEM OF ACTIVE ELEMENTS

(75) Inventors: Christian Outin, Beaumont sur Olse (FR); Patrick Bureau, Bessancourt (FR); Jérôme David, Osny (FR); Thierry Parquet, Boussy St Antoine (FR); Didler Martineau, Conflans Sainte Honorine (FR)

(73) Assignee: PL Technologies AG, Schindellegi (CH)

( * ) Notice: Subject to any disclaimer, the term of this patent is extended or adjusted under 35 U.S.C. 154(b) by 0 days.

(21) Appl. No.: 12/998,192

(22) PCT Filed: Oct. 2, 2009

(86) PCT No.: PCT/FR2009/051885
§ 371 (c)(1),
(2), (4) Date: Mar. 25, 2011

(87) PCT Pub. No.: WO2010/037987
PCT Pub. Date: Apr. 8, 2010

(65) Prior Publication Data
US 2011/0175679 A1    Jul. 21, 2011

(30) Foreign Application Priority Data

Oct. 2, 2008 (FR) ...................................... 08 56689

(51) Int. Cl.
H03F 3/68 (2006.01)
(52) U.S. Cl. .......................... 330/295; 330/136; 330/297
(58) Field of Classification Search .............. 330/124 R, 330/295, 84, 286, 296–297, 136
See application file for complete search history.

(56) References Cited

U.S. PATENT DOCUMENTS

| | | | |
|---|---|---|---|
| 7,619,468 B1 * | 11/2009 | Bowles et al. | 330/124 R |
| 2008/0224769 A1 * | 9/2008 | Markowski et al. | 330/10 |

FOREIGN PATENT DOCUMENTS

| | | |
|---|---|---|
| EP | 1450479 | 8/2004 |
| WO | WO0247249 | 6/2002 |
| WO | WO2004114516 | 12/2004 |

* cited by examiner

*Primary Examiner* — Hieu Nguyen
(74) *Attorney, Agent, or Firm* — Michael Best & Friedrich LLP

(57) ABSTRACT

The present invention relates to a power supply control network of an amplifying active elements system enabling at least one control signal to be transmitted to N different control systems of the power supply voltage of P different composed active amplifying elements. It comprises a set of distributor elements of power supply control signals connected in cascade.

2 Claims, 1 Drawing Sheet

1, 10, 100  distribution of the power supply control signal
2  single active amplifying element
3  power supply variation system
4  RF input
5  RF output
6  composed active amplifying element
7  power supply control from modulating signal: coarse adjustment
8  power supply control from modulating signal: fine adjustment

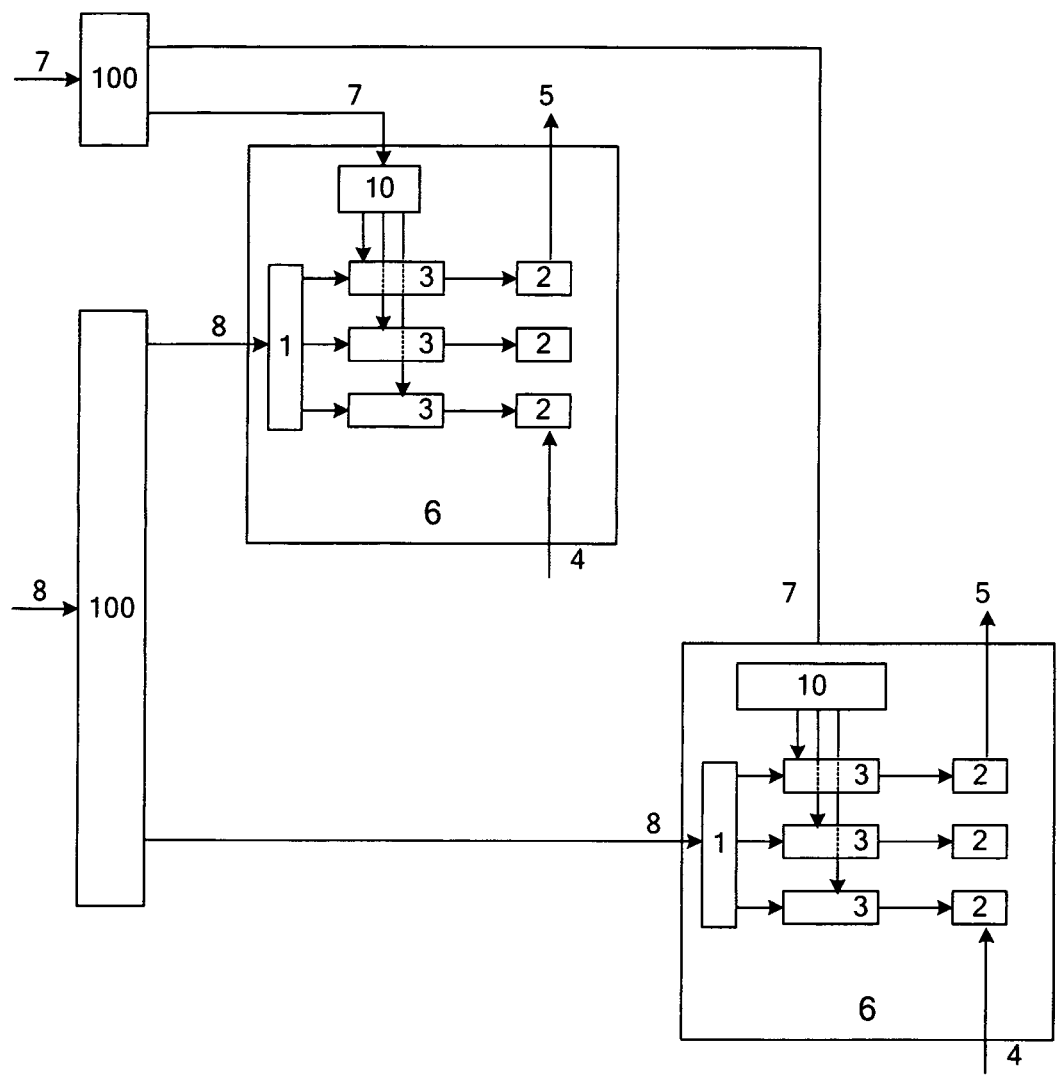
| 1, 10, 100 | distribution of the power supply control signal |
| 2 | single active amplifying element |
| 3 | power supply variation system |
| 4 | RF input |
| 5 | RF output |
| 6 | composed active amplifying element |
| 7 | power supply control from modulating signal: coarse adjustment |
| 8 | power supply control from modulating signal: fine adjustment |

NETWORK FOR CONTROLLING THE POWER SUPPLY TO A SYSTEM OF ACTIVE ELEMENTS

This application claims the benefit, under 35 U.S.C. §365 of International Application PCT/FR2009/051885, filed Oct. 2, 2009, which was published in accordance with PCT Article 21(2) on Apr. 8, 2010 in French and which claims the benefit of French patent application No. 0856689, filed Oct. 2, 2008.

The invention relates to a power supply control network of an amplifying active elements system. It relates more specifically but not exclusively to the power amplifiers of a transmitter used in the broadcast domain.

A power transmitter comprises a large number of single active amplifying elements voltage controlled by a signal generated by a power supply voltage control system. A number N of single active amplifying elements are grouped into composed active amplifying elements. The amplifying system can be composed of P composed active elements.

For example, an amplifying system can be formed by at least one bay, each bay comprising possibly 8 amplifying stages each comprising for example 16 power transistors.

The invention relates to the power control network of this PXN set of single active amplifying elements and proposes a network architecture enabling the control of single active amplifying elements to be optimised.

FIG. 1 shows a simplified architecture of this network.

Considering a first composed active amplifying element 6, the input RF signal 4 is amplified by each single active amplifying element 2 into a single output signal 5.

The single active amplifying elements can be power transistors mounted in "push pull". It involves for example LDMOS technology transistors.

All of the amplified signals will then be combined and transmitted.

Each single active amplifying element is controlled by a unit of the power supply voltage control system SCTA 3 connected to the elements 1, 10, distributing the power supply control signals.

The control signals 7 and 8 are from the modulating signal of the input signal. A first signal 7 enables a coarse adjustment while the second signal 8 enables a fine adjustment.

The architecture is organised in such a way that each analogue or digital control signal 7, 8 is distributed by the power supply control signals distributor elements 100 to the P composed active amplifying elements 6.

Each of the P composed active amplifying elements themselves comprise distributors 1 and 10 via N power supply control signals. This cascade architecture enables an economic control of the power supply voltage control system 3 the role of which is to modulate the power supply voltage via the first coarse adjustment control signal 7 and via the second fine adjustment control signal 8.

Thus via the intermediary of these power supply control signal distributors 1, 10, 100, the controls for a coarse adjustment as for a fine adjustment are applied to the power supply voltage control system SCTA.

This principle of control via digital or analogue signals can be adapted by cascading the power supply control signal distributor elements 1, 10, 100.

The invention claimed is:

1. A power supply control network for a system of amplifying active elements grouped into P composed active amplifying elements, the power supply control network enabling a coarse adjustment control signal and a fine adjustment control signal to be transmitted to N different power supply voltage control systems of P different composed active amplifying elements, the power supply network comprising first and second control signal distributor elements connected in cascade, such that the coarse adjustment control signal and the fine adjustment control signal are distributed by the first distributor elements to the second distributor elements of each P composed active amplifying element that themselves redistribute each control signal to the N different power supply voltage control systems for the amplifying active elements.

2. The power supply control network for a system of amplifying active elements according to claim 1 wherein the active amplifying elements include power transistors.

* * * * *